United States Patent
Kuo et al.

(10) Patent No.: US 8,384,113 B2
(45) Date of Patent: Feb. 26, 2013

(54) PHOTOELECTRIC DEVICE

(75) Inventors: Chester Kuo, Hsinchu (TW); Hung-Chin Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 10 days.

(21) Appl. No.: 13/306,815

(22) Filed: Nov. 29, 2011

(65) Prior Publication Data

US 2012/0068216 A1 Mar. 22, 2012

Related U.S. Application Data

(62) Division of application No. 12/879,206, filed on Sep. 10, 2010, now Pat. No. 8,093,078.

(30) Foreign Application Priority Data

Sep. 18, 2009 (CN) .......................... 2009 1 0177043

(51) Int. Cl.
- *H01L 33/60* (2010.01)
- *H01L 33/58* (2010.01)
- *H01L 33/64* (2010.01)
- *H01L 33/50* (2010.01)

(52) U.S. Cl. ........... 257/98; 257/E33.061; 257/E33.073; 257/E33.072; 257/E33.075

(58) Field of Classification Search ........................ None
See application file for complete search history.

(56) References Cited

U.S. PATENT DOCUMENTS

| | | | |
|---|---|---|---|
| 2005/0263784 A1* | 12/2005 | Yaw et al. ........................ 257/98 |
| 2006/0105484 A1* | 5/2006 | Basin et al. ...................... 438/27 |
| 2008/0079182 A1 | 4/2008 | Thompson et al. | |
| 2012/0056223 A1* | 3/2012 | Hsieh et al. ..................... 257/98 |

FOREIGN PATENT DOCUMENTS

| | | |
|---|---|---|
| CN | 101507003 A | 8/2009 |
| TW | 200616248 A | 5/2006 |

* cited by examiner

*Primary Examiner* — Seahvosh Nikmanesh
(74) *Attorney, Agent, or Firm* — Altis Law Group, Inc.

(57) ABSTRACT

A photoelectric device includes a ceramic substrate defining a cavity in a top thereof and having two electrode layers beside the cavity. A photoelectric die is received in the cavity. A first packing layer is received in the cavity and encapsulates the photoelectric die. The photoelectric die is electrically connected with the electrode layers via two wires. A reflective cup is mounted on the ceramic substrate and defines a receiving space above the top of the ceramic substrate and the first packing layer. A second packing layer is received in the receiving space and covers the first packing layer.

11 Claims, 17 Drawing Sheets

PHOTOELECTRIC DEVICE

This application is a divisional application of U.S. application Ser. No. 12/879,206 filed 10 Sep. 2010, and is based on and claims priority from China Patent Application No. 200910177043.6 filed 18 Sep. 2009.

TECHNICAL FIELD

The present invention relates to a method of fabricating a photoelectric device, and relates more particularly to a photoelectric device, a method of fabricating the same, and a packaging apparatus for the same.

DESCRIPTION OF THE RELATED ART

Light emitting diodes (LEDs) in photoelectric devices have advantages such as low power consumption, high brightness, compact physical size, and extensive lifespan; thus, LEDs are considered to be the best light source for an eco-friendly, energy conservative next generation illumination system. If a lens is disposed on the light output surface of an LED, total reflection and light scattering phenomena can be minimized, and the light extraction efficiency of the LED can be improved. FIG. 1 is a stereoscopic view showing an LED package 100 having a dual structure disclosed in U.S. Pat. No. 7,458,703. The LED package 100 includes a lower structure 110, a lower lens 160, and an upper lens 180. The lower structure 110 comprises a package body 130 and a lead 120. After being packaged, the lower lens 160 and the upper lens 180 are assembled together to form a structure with an hourglass shape, thereby laterally emitting light from the LED. However, the lower lens 160 and the upper lens 180 are molded independently from each other; thus, the cost of the LED package 100 is high, and a lot of manpower and extra assembly procedures are needed.

Therefore, a photoelectric device having a lens structure, a method of mass producing the photoelectric device, and a packaging apparatus for the photoelectric device are required. The photoelectric device may adopt a ceramic substrate of high thermal conductivity as its substrate so as to improve its heat dissipation efficiency. The method and the apparatus can effectively avoid the issue of the ceramic substrate being easily broken during device packaging so that the reliability and production yield of the photoelectric device can be improved.

SUMMARY

The present invention provides a method for fabricating a photoelectric device and a packaging apparatus for packaging a photoelectric device, and more particularly related to a method for fabricating a photoelectric device formed on a ceramic substrate and a packaging apparatus for packaging the photoelectric device. The proposed method and apparatus may avoid the breakage issue of the ceramic substrate during the packaging process, improving the reliability and yield of production of the photoelectric device.

The present invention provides a method for fabricating a photoelectric device, which comprises the steps of: providing a ceramic substrate, comprising a thermal dissipation layer on a bottom layer of the ceramic substrate, an electrode layer on the top surface of the ceramic substrate, and a reflective structure in cavities of the ceramic substrate; forming a plurality of photoelectric dies on a top surface of the ceramic substrate; forming a first packaging layer on top surfaces of the plurality of photoelectric dies; loading the ceramic substrate between a lower mold and an upper mold; and forming a plurality of lenses on a top surface of the first packaging layer by injection molding or transfer molding.

The present invention provides a photoelectric device, which comprises a ceramic substrate, a photoelectric die, a reflective cup, a first packaging layer, a second packaging layer, and a lens structure. The ceramic substrate comprises a thermal dissipation layer and at least two electrode layers electrically insulating from the thermal dissipation layer. The photoelectric die is disposed on a top surface of the thermal dissipation layer and electrically connects to the at least two electrode layers. The reflective cup is disposed on a top surface of the first electrode layer so as to form a first accommodation space, wherein the reflective cup comprises a slantwise surface. The first packaging layer is disposed on a top surface of the photoelectric die. The second packaging layer is disposed within the first accommodation space and is disposed on a top surface of the first packaging layer. The lens structure is attached in the accommodation space and is disposed on a top surface of the second packaging layer The present invention provides another photoelectric device, which comprises a ceramic substrate, a photoelectric die, a plurality of reflective cups, a plurality of packaging layers, and a lens structure. The ceramic substrate comprises a thermal dissipation layer and at least two electrode layers electrically insulating from the thermal dissipation layer. The photoelectric die is disposed on a top surface of the thermal dissipation layer and electrically connects to the at least two electrode layers. The plurality of reflective cups is disposed on a top surface of the first electrode layer so as to form an accommodation space. The plurality of packaging layers is disposed within the accommodation space, wherein at least one of the plurality of packaging layers is disposed on the photoelectric die. The lens structure is attached on the ceramic substrate and covers the plurality of packaging layers To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION

Figure 1:
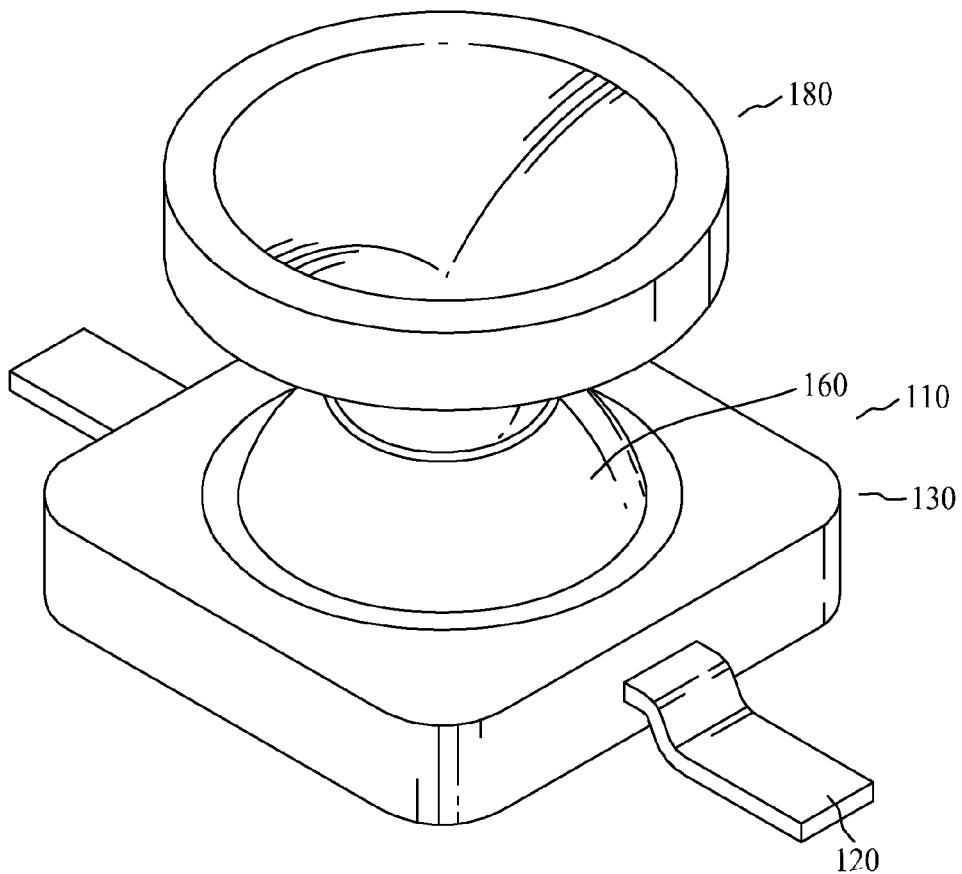
FIG. 1 is a stereoscopic view showing an LED package having a dual structure disclosed in U.S. Pat. No. 7,458,703.
Figure 2:
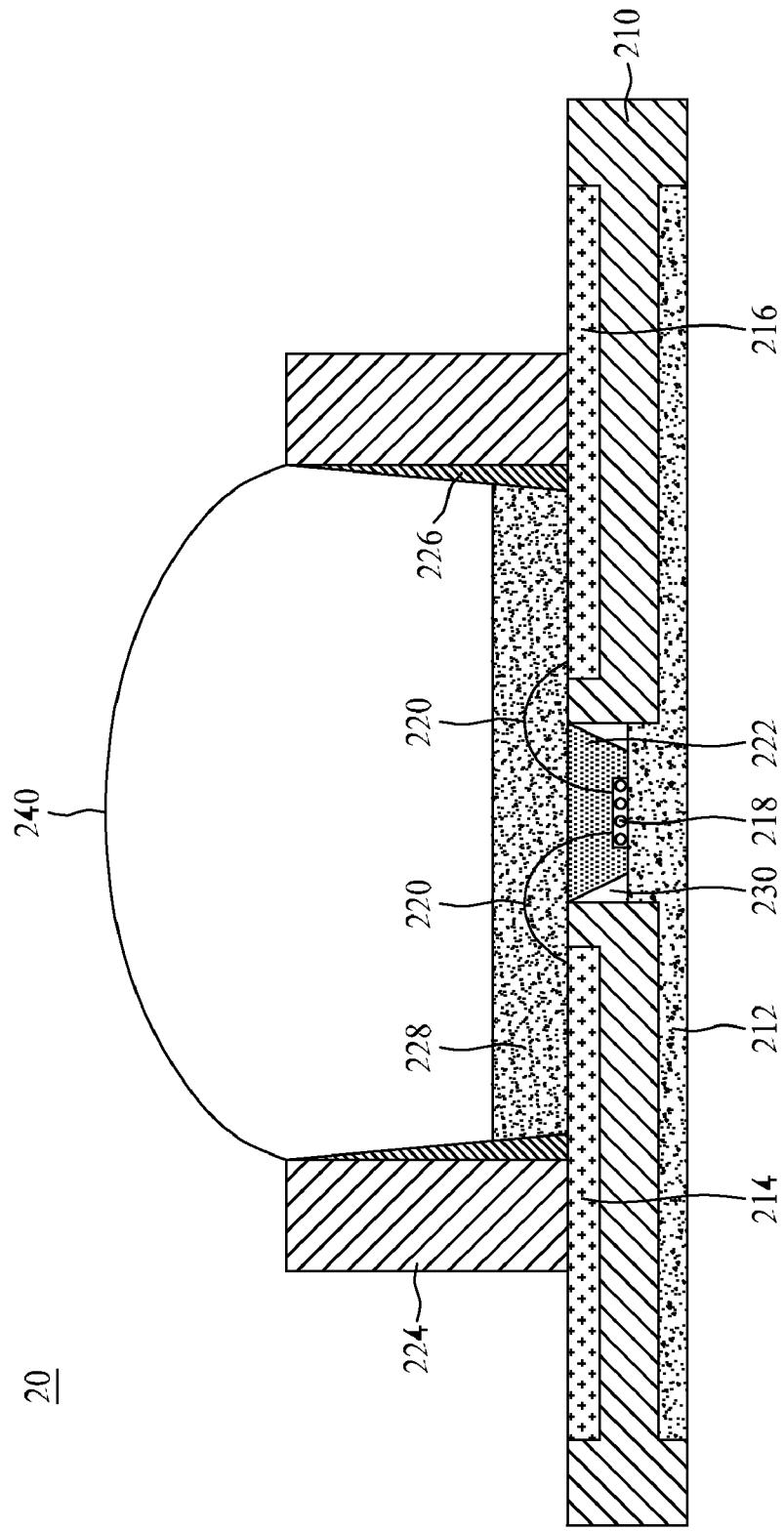
FIG. 2 is a cross-sectional view showing a photoelectric device according to one embodiment of the present invention.

FIG. 2 is a cross-sectional view showing a photoelectric device 20 according to one embodiment of the present invention. The photoelectric device 20 adopts a ceramic substrate 210 as its substrate. The ceramic substrate 210 can be of high temperature co-fired ceramics or of low temperature co-fired ceramics. The ceramic substrate 210 is usually made of aluminum oxide; however, other material such as aluminum nitride (AlN), beryllium oxide (BeO), silicon carbide (SiC), glass, or diamond can be used to manufacture the ceramic substrate 210.

Referring to FIG. 2, the photoelectric device 20 comprises a thermal dissipation layer 212, a p-type electrode layer 214, and an n-type electrode layer 216, wherein the p-type electrode layer 214 and the n-type electrode layer 216 are able to electrically connect to an external power source (not shown). The thermal dissipation layer 212 may include any thermally conductive material, for example, metal. A photoelectric die 218 is disposed on the top surface of the thermal dissipation layer 212. The patterns of the p-type and n-type electrode layers 214 and 216 can be formed using semiconductor processes, for example, including a vapor deposition process or sputtering deposition, a photolithographic process, an electroplating or chemical plating process, and an etching process. A reflective structure 230, which is formed using ceramic or metal by, for example, a sputtering process or formed using non-metal by a molding process, can be formed on the top surface of thermal dissipation layer 212 and a central cavity of the ceramic substrate 210, thereby increasing light reflectance. The photoelectric die 218 disposed on the top surface of the thermal dissipation layer 212 of the ceramic substrate 210 can be wire bonded or flip-chip bonded. The wires 220 in FIG. 2 are used to electrically connect the pads of the photoelectric die 218 to the p-type and n-type electrode layers 214 and 216.

During the packaging process, a first packaging layer 222 is filled into the accommodation space formed by the reflective structures 230 and the top surface of the photoelectric die 218 for enclosing the photoelectric die 218. The first packaging layer 222 comprises phosphor powder mixed with epoxy resin, silicone resin, or a mixture thereof. The phosphor powder may absorb light from the photoelectric die 218 and generate light of different wavelength. A reflective cup 224 is formed on the top surface of the ceramic substrate 210. The reflective cup 224 is usually made of opaque or highly reflective resin. The reflective cup 224 may include a highly reflective metal film 226 slantedly formed thereon to increase light reflectance, wherein the highly reflective metal film 226 is made of metal or highly reflective material. In addition, in the reflective cup 224, a second packaging layer 228 can be formed to enclose the first packaging layer 222 and the wires 220 for further protecting the photoelectric die 218 from the damage caused by external force or by weather. The second packaging layer 228 is made of epoxy resin, silicone, or mixed with foresaid material with phosphor powder. Further, a lens structure 240 can be directly formed in the accommodation space of the reflective cup 224 so as to avoid the alignment issue or assembly issue related to prior art photoelectric devices.

Figure 3:
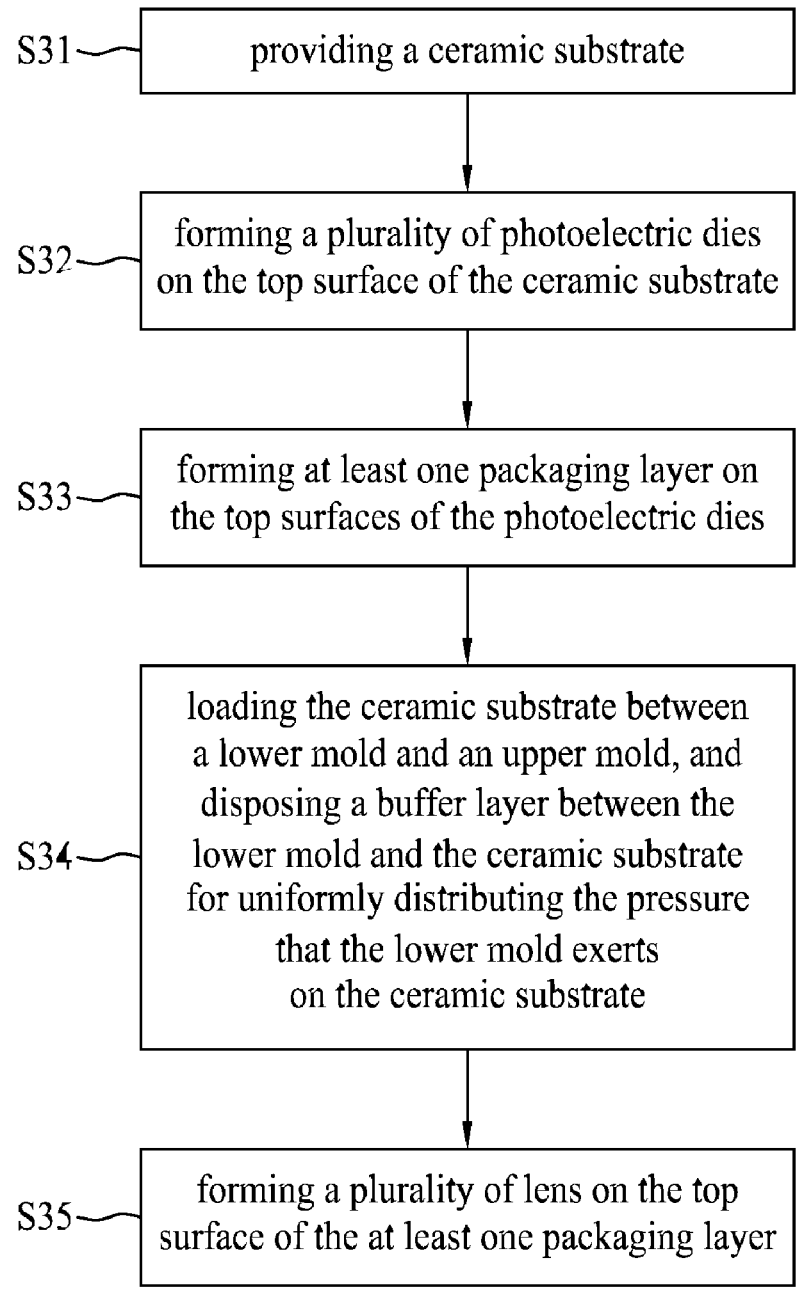
FIG. 3 is a flow chart showing the steps of a method for fabricating a photoelectric device according to one embodiment of the present invention.

FIG. 3 is a flow chart showing the steps of a method for fabricating a photoelectric device according to one embodiment of the present invention. In Step S31, a ceramic substrate is provided, wherein the ceramic substrate comprises a thermal dissipation layer on a bottom layer of the ceramic substrate, an electrode layer on the top surface of the ceramic substrate, and a reflective structure in cavities of the ceramic substrate. In Step S32, a plurality of photoelectric dies is formed on the top surface of the ceramic substrate. In Step S33, at least one packaging layer is formed on the top surfaces of the photoelectric dies. In Step S34, the ceramic substrate is loaded between a lower mold and an upper mold, and a buffer layer is disposed between the lower mold and the ceramic substrate for uniformly distributing the pressure that the lower mold acts on the ceramic substrate. In Step S35, a plurality of lenses are formed on the top surface of the at least one packaging layer. Steps S31 to S33 are as described above, and the details of the method steps are explained with FIGS. 4A to 4C hereinafter.

Figure 4A:
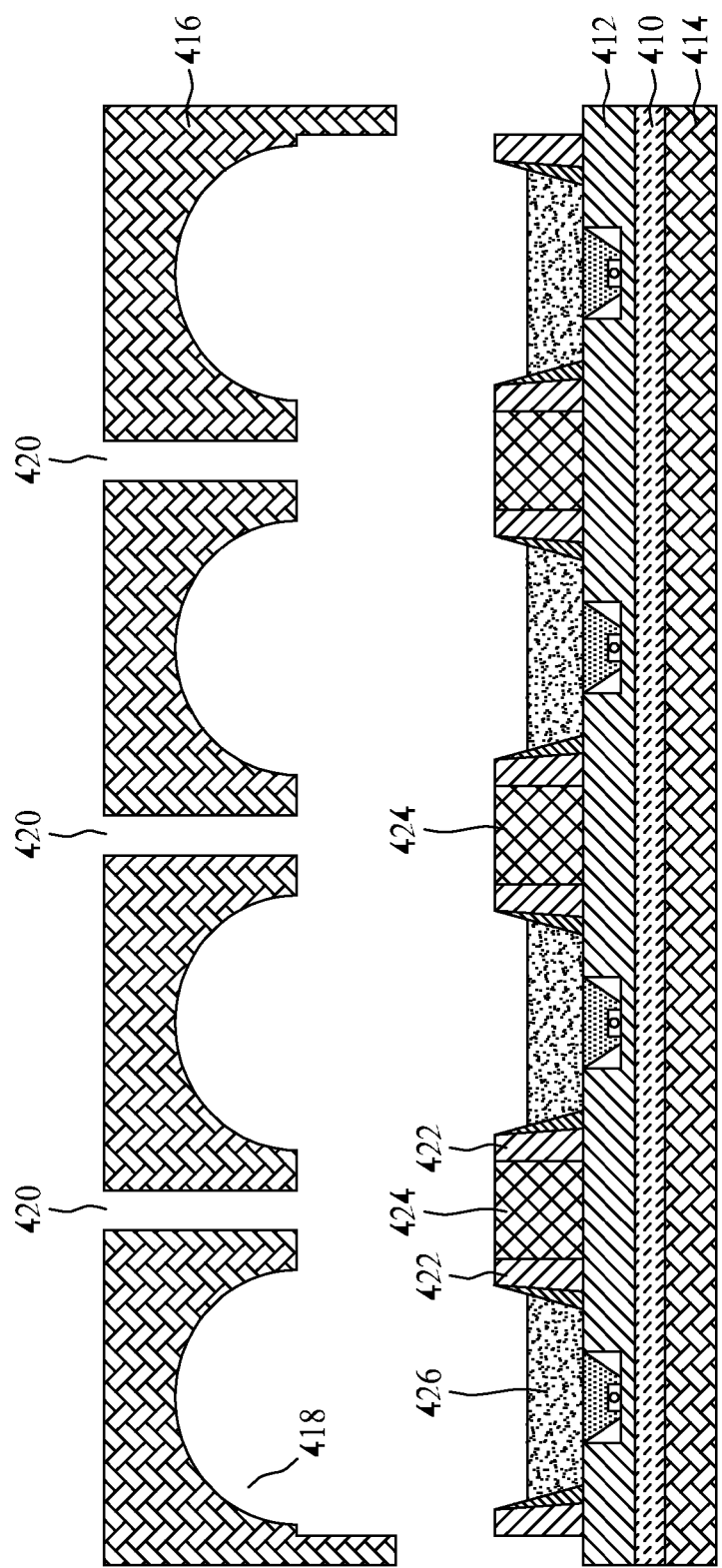
FIGS. 4A to 4C are cross-sectional views showing a method for fabricating a photoelectric device using an injection molding process according to one embodiment of the present invention.
Figure 4B:
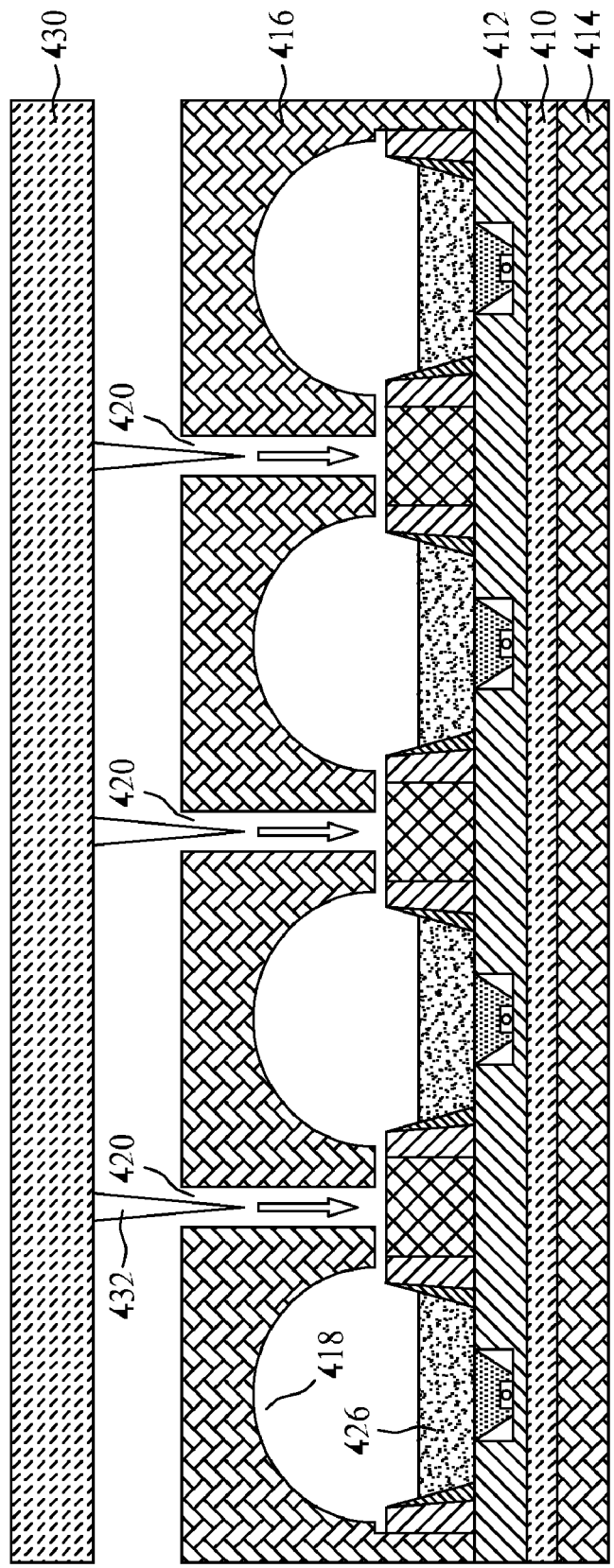
Figure 4C:
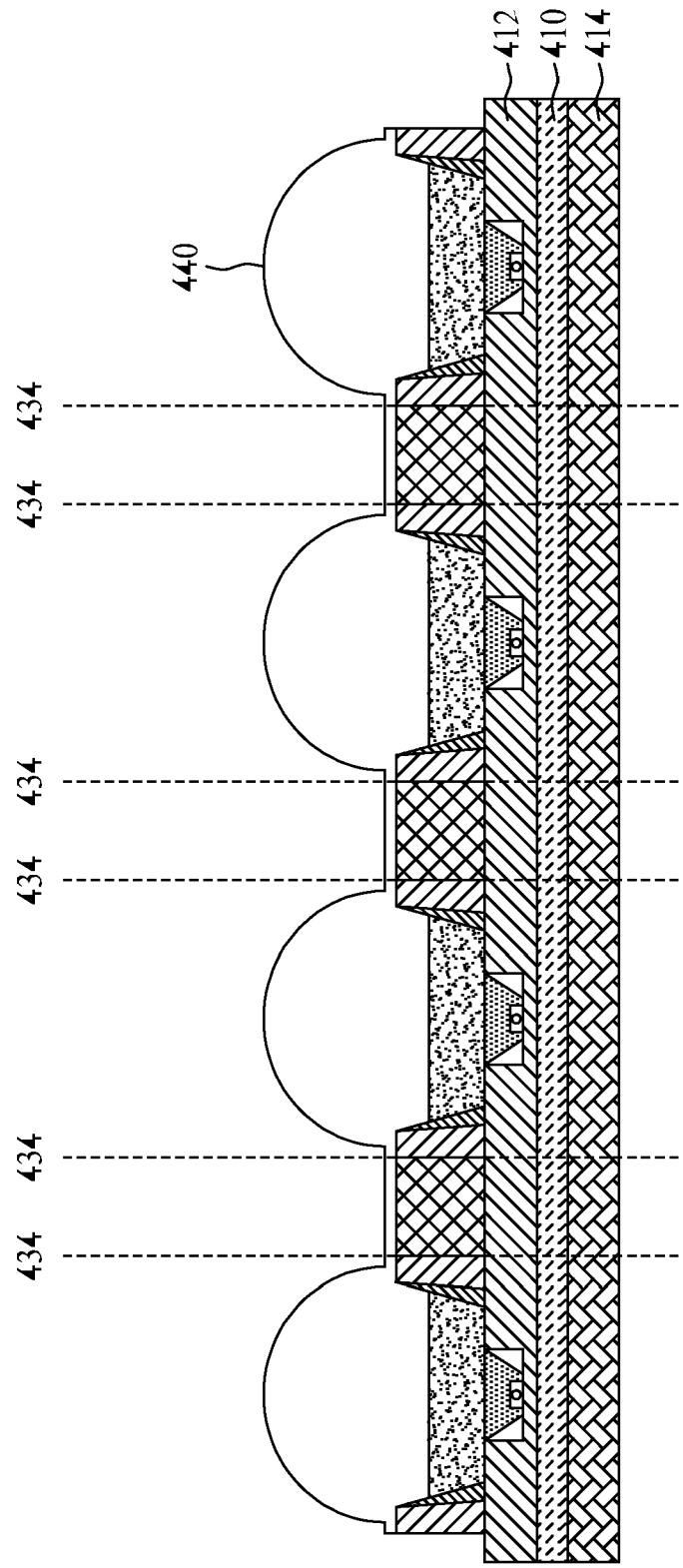

FIGS. 4A to 4C are cross-sectional views showing a method for fabricating a photoelectric device using an injection molding process according to one embodiment of the present invention. In FIG. 4A, a plurality of reflective cups 422 and a packaging layer 426 are formed on a ceramic substrate 412, and a plurality of block members 424 are formed between the plurality of reflective cups 422. In order to form a lens structure on the top surface of the ceramic substrate 412 using a molding process, a buffer layer 410 is disposed or formed on the top surface of a lower mold 414, as shown in FIG. 4A. Thereafter, the ceramic substrate 412 is loaded between the lower mold 414 and an upper mold 416, which includes a mold surface 418 configured to form a plurality of lenses and a plurality of melt channels 420 corresponding to the plurality of block members 424.

Next, the lower mold 414 and the upper mold 416 are closed and molten material is introduced. As shown in FIG. 4B, an injection device 430 injects molten material through the melt channel 420 to nozzles 432. When the molds 414 and 416 are closed and the molten material is injected, the lower mold 414 directly applies pressure on the bottom surface of the ceramic substrate 412. If the ceramic substrate 412 is not flat, high local stresses may occur. Although the ceramic substrate 412 is of high hardness, the ceramic substrate is fragile so that bending stresses may easily break it. The buffer layer 410 is a solution for the flatness issue of the ceramic substrate 412, or for the flatness issue of the lower mold 414. The buffer layer 410 can uniformly distribute the pressure applied by the lower mold 414 to the surface of the ceramic substrate 412. After the molten material which is introduced into cavities between the upper mold 416 and the packaging layer 426 is cooled and solidified, a mold opening step is performed so as to separate the lower mold 414, the upper mold 416, and the buffer layer 410. The disposition of the buffer layer 410 can also reduce the impact of the pressure produced by mold closing and molten material injection so that the ceramic substrate 412 can avoid breakage when it undergoes pressure during the molding process, increasing the reliability of production and production yield of the photoelectric device.

After the molds 414 and 416 are opened, photoelectric devices having lens structures 440 are complete. Next, as shown in FIG. 4C, cutting lines 434 are formed on the ceramic substrate 412 using a laser or by a molding process. Thereafter, a diamond knife, laser or water knife is used to cut the ceramic substrate 412 along the cutting lines 434 to obtain separated photoelectric devices 20 as shown in FIG. 2. Alternatively, the ceramic substrate 412 can be manually broken to obtain separated photoelectric devices 20.

In the above embodiments, the block members 424 are disposed between the plurality of reflective cups 422 so as to form a plurality of photoelectric devices having lens structures. In another embodiment, a film layer, labeled in FIG. 5D as 524, can be formed between the plurality of reflective cups 422 such that the electrode layers on the ceramic substrate 412 can be protected from damage when the molds 414 and 416 are closed and the molten material is injected. The film layer 524 can be stripped from the ceramic substrate 412, and the remnant adhesive on the film layer 524 or the adhesive blocks in the runners can be simultaneously removed when the film layer is stripped. After the film layer 524 is removed, a plurality of separated lens structures 440 is formed on the ceramic substrate 412.

Figure 5A:
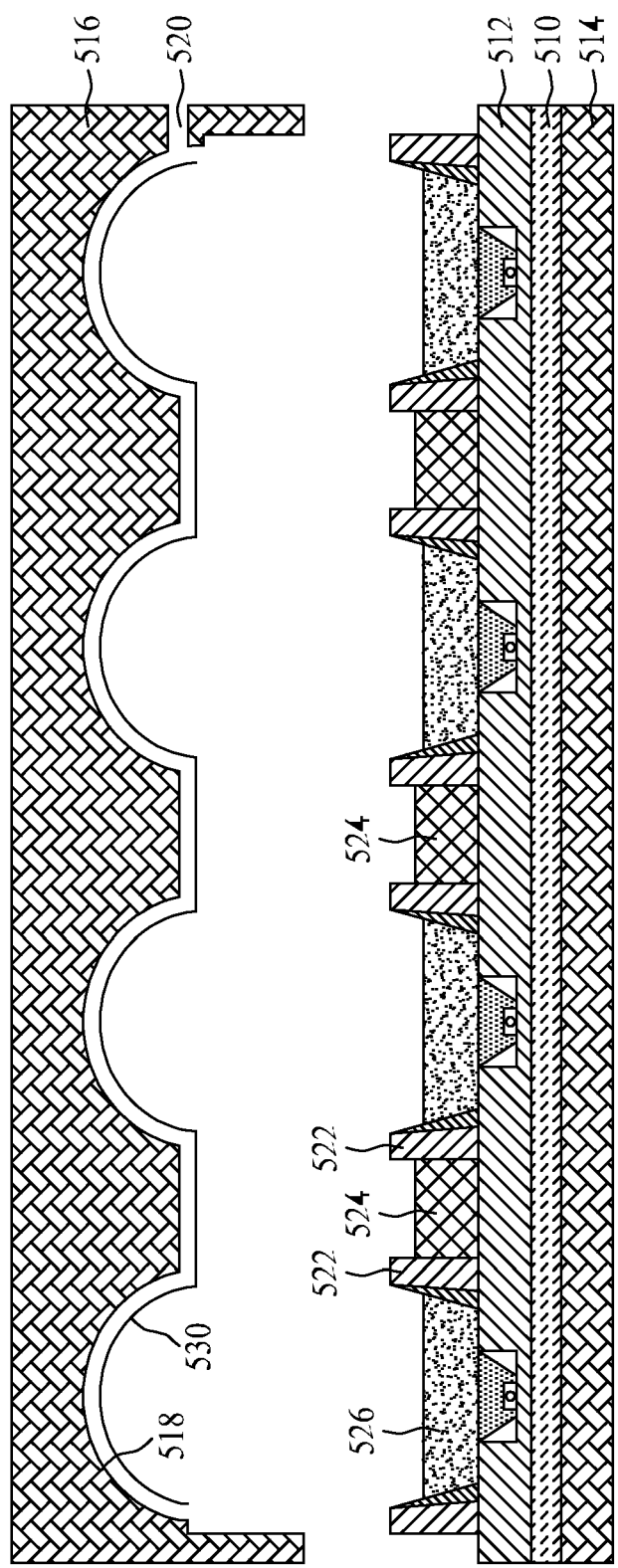
FIGS. 5A to 5D are cross-sectional views showing a method for fabricating a photoelectric device using a transfer molding process according to one embodiment of the present invention.

FIGS. 5A to 5D are cross-sectional views showing a method for fabricating a photoelectric device using a transfer molding process according to one embodiment of the present invention. As shown in FIG. 5A, a plurality of reflective cups 522 and a packaging layer 526 are formed on the top surface of a ceramic substrate 512, and a film layer 524 is formed between the plurality of reflective cups 522. The disposition of the film layer 524 is for protecting the electrode layers (not shown) on the ceramic substrate 512 from damage when the molds 514 and 516 are closed and the molten material is injected. Similarly, in order to form a lens structure on the top surface of the ceramic substrate 512 using a molding process, a buffer layer 510, as shown in FIG. 5A, is disposed or formed on the top surface of a lower mold 514. Next, the ceramic substrate 512 is loaded between the lower mold 514 and an upper mold 516, which includes a mold surface 518 configured to form a plurality of lenses and a plurality of lateral melt channels 520.

Figure 5B:
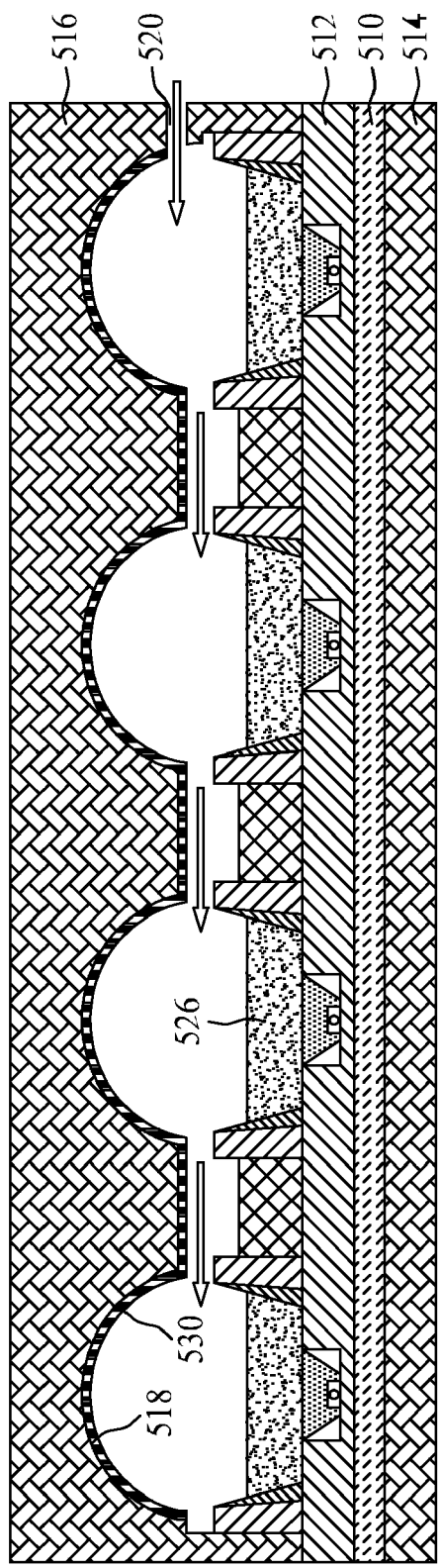

As shown in FIG. 5A, a dummy mold 530 is disposed between the ceramic substrate 512 and the upper mold 516. The dummy mold 530 includes a mold surface, which is configured to have a shape to form a plurality of lenses. The mold surface of the dummy mold 530 can be different from that of the upper mold 516, thereby forming lens structures with different configurations. Alternately, the mold surface of the dummy mold 530 can be the same as that of the upper mold 516, thereby obtaining smoother configurations of lens structures. Certainly, the mold surface 518 of the upper mold 514 can be further treated to become smoother by, for example, an electro-polishing process. Referring to FIG. 5B, when the lower mold 514, the upper mold 516, and the dummy mold 530 are closed, a plurality of cavities communicating with each other are formed on the top surface of the packaging layer 526.

Figure 5C:
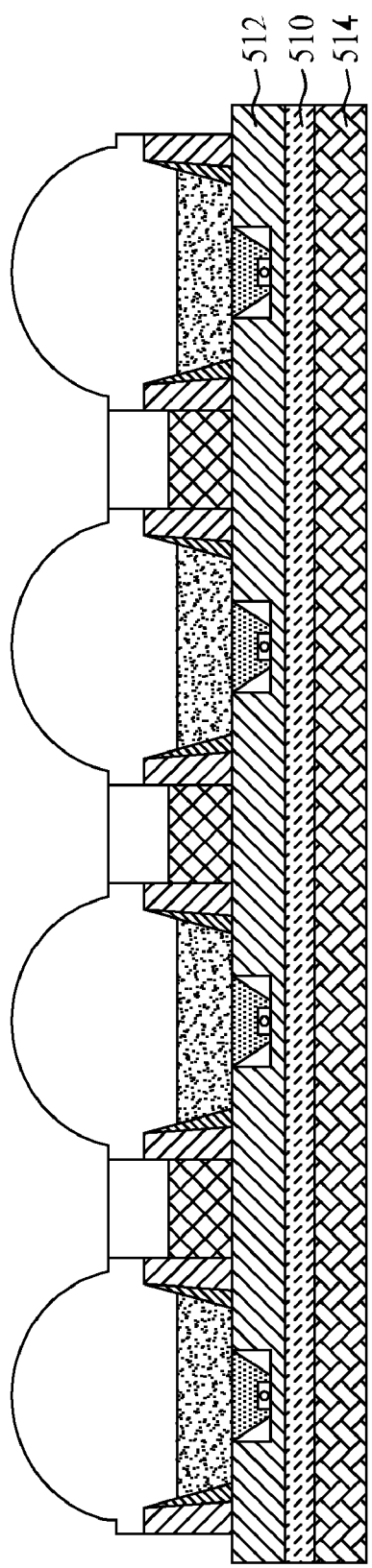
Figure 5D:
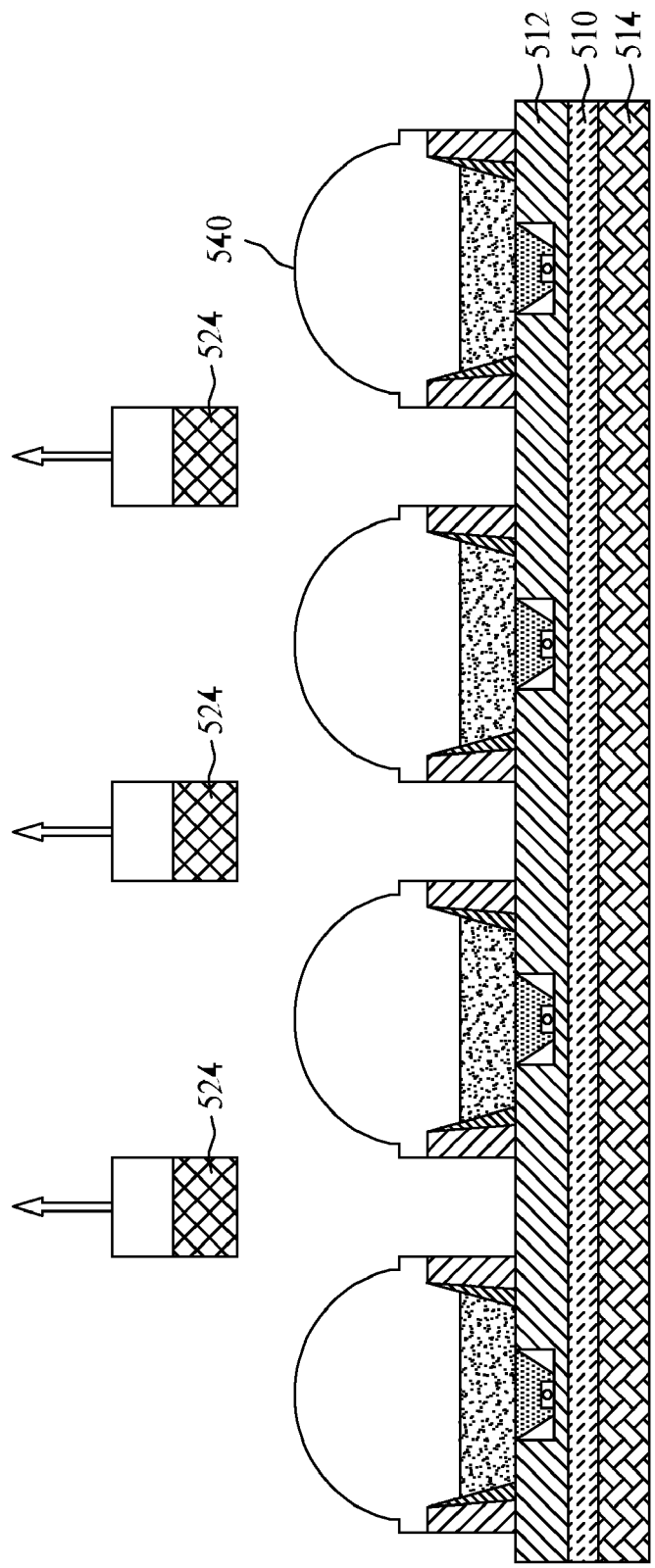

Thereafter, an injection device injects molten material from the lateral melt channel 520. Referring to FIG. 5C, after the molten material introduced into cavities between the upper mold 516 and the packaging layer 526 is cooled and solidified, the lower mold 514, the buffer layer 510, the upper mold 516, and the dummy mold 530 are removed. The film layer 524 can be stripped from the ceramic substrate 512, and the remnant adhesive on the film layer 524 or the adhesive blocks in the runners can be simultaneously removed when the film layer 524 is stripped. After the film layer 524 is removed, a plurality of separated lens structures 540 is formed as shown in FIG. 5D. In addition, the film layer 524 has a buffering effect; it can absorb the pressure that the upper mold 516 applies on the surface of the ceramic substrate 512. After the ceramic substrate 512 is detached, photoelectric devices with lens structures are completed. Finally, cutting lines are formed on the ceramic substrate 512 using a laser or by a molding process, and a diamond knife, laser or water knife is used to cut the ceramic substrate 512 along the cutting lines to obtain separated photoelectric devices.

Figure 6A:
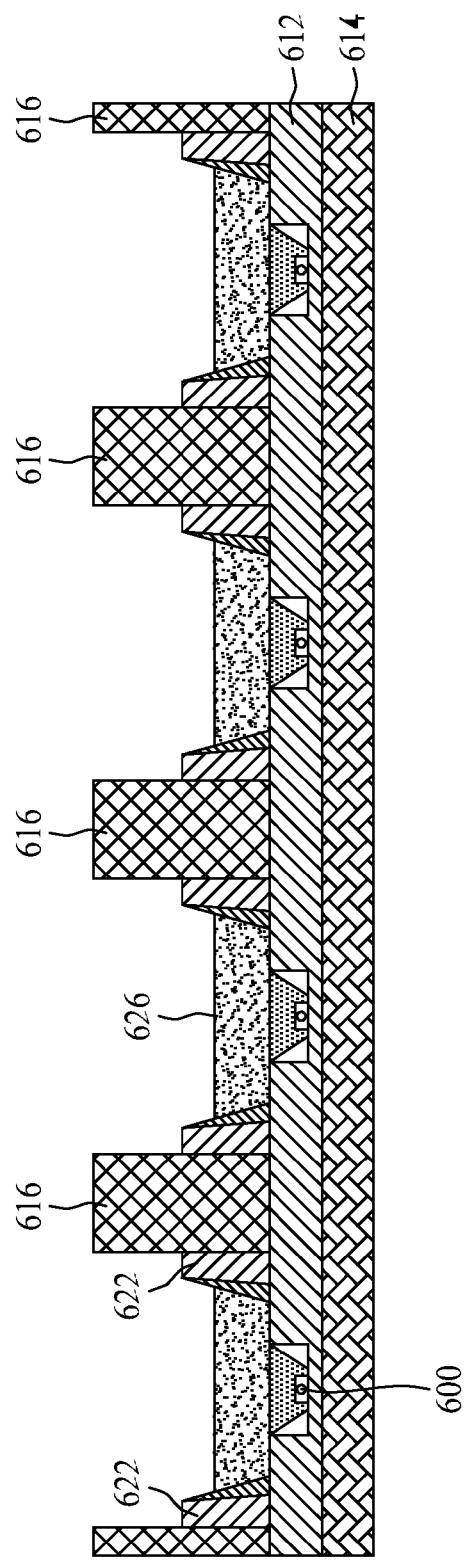
FIGS. 6A to 6D are cross-sectional views showing a method for fabricating the lens structure of a photoelectric device using a printing process according to one embodiment of the present invention.

FIGS. 6A to 6D are cross-sectional views showing a method for fabricating the lens structure of a photoelectric device using a printing process according to one embodiment of the present invention. In FIG. 6A, a plurality of reflective cups 622 and a packaging layer 626 are formed on the top surface of a ceramic substrate 612. In order to form a lens structure on the top surface of the ceramic substrate 612, the ceramic substrate 612 is loaded between the lower mold 614 and an upper mold 616. The upper mold 616 is configured to extend into the gaps between the plurality of reflective cups 622 to isolate the photoelectric dies 600, and the upper mold 616 has a height sufficient to form a plurality of accommodation spaces respectively surrounding the photoelectric devices.

Figure 6B:
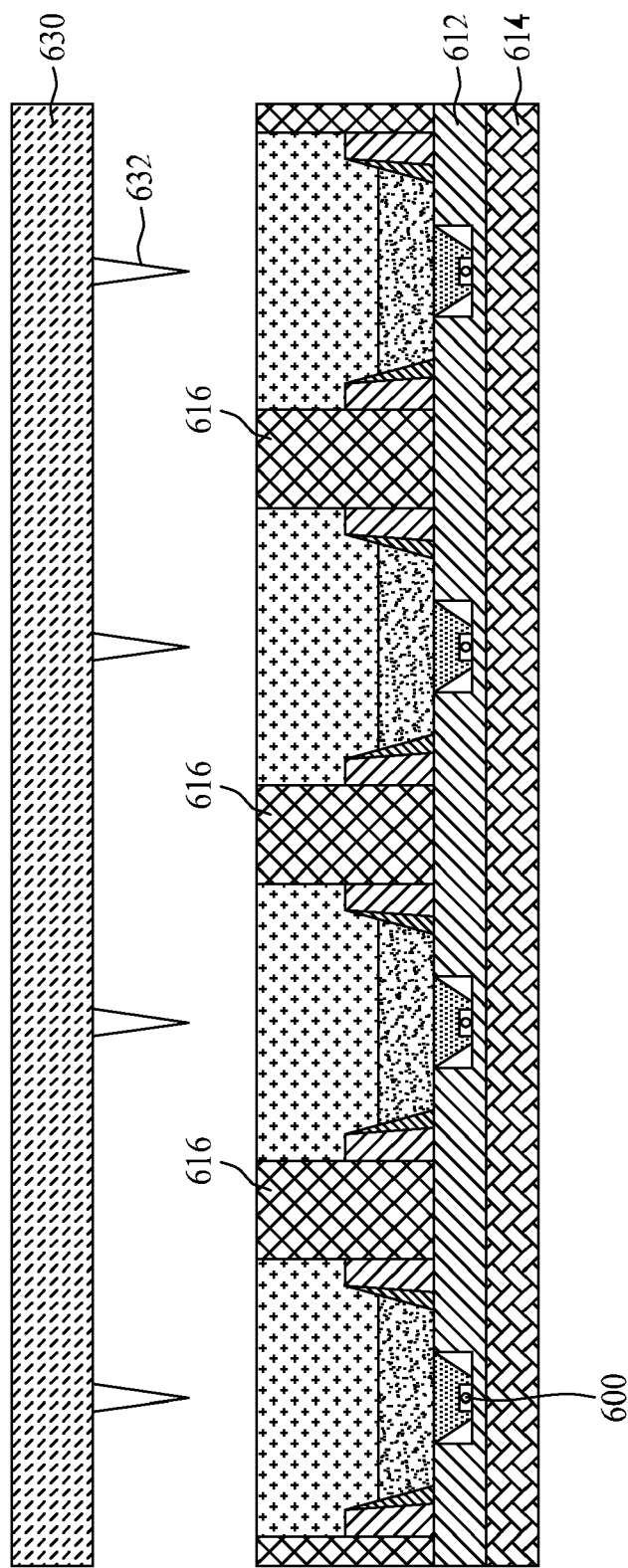
Figure 6C:
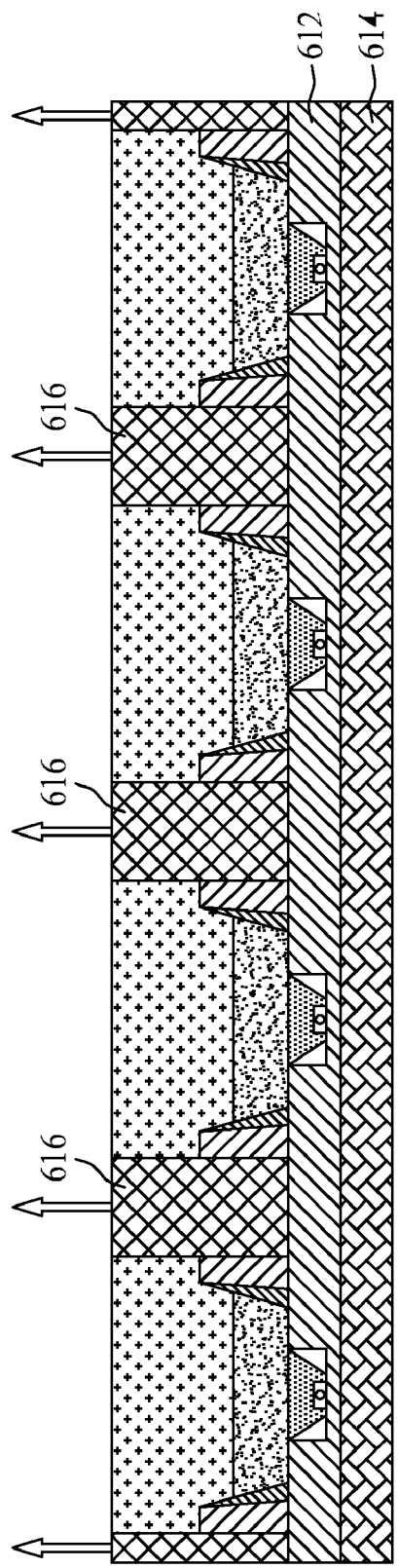
Figure 6D:
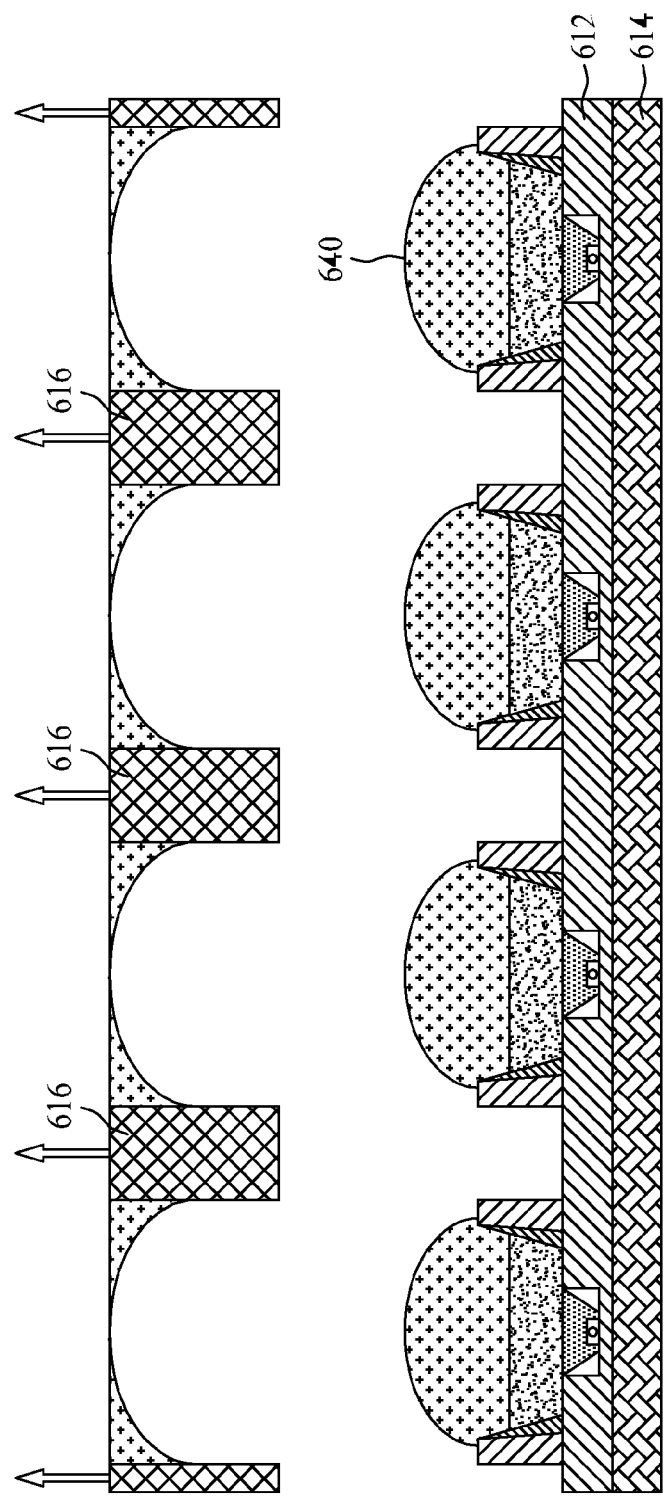

Referring to FIG. 6B, an injection device 630 injects molten material into the accommodation spaces through nozzles 632 corresponding to the accommodation spaces. After the accommodation spaces are fully filled with molten material, and the filled molten material is cooled and solidified, the upper mold 616 and the lower mold 614 are separated as shown in FIGS. 6C and 6D. After detachment, the material in the accommodation spaces may be formed into lens structures 640 on the photoelectric dies 600 due to internal cohesion of the material. Finally, cutting lines are formed on the ceramic substrate 612 using a laser or by a molding process, and a diamond knife, laser or water knife is used to cut the ceramic substrate 612 along the cutting lines to obtain separated photoelectric devices.

Figure 7A:
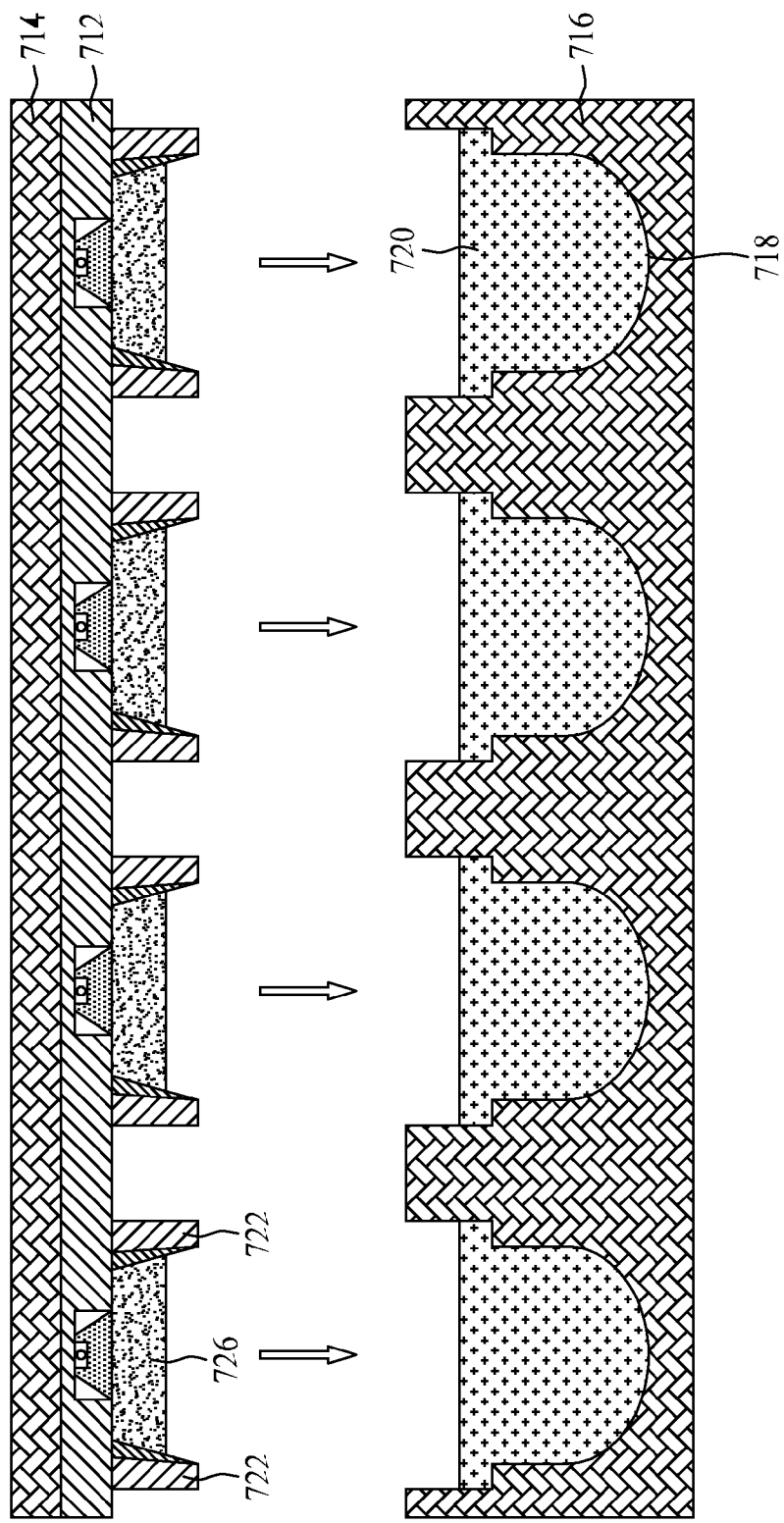
FIGS. 7A to 7C are cross-sectional views showing a method for fabricating the lens structure of a photoelectric device using a dipping and cooling process according to one embodiment of the present invention.
Figure 7B:
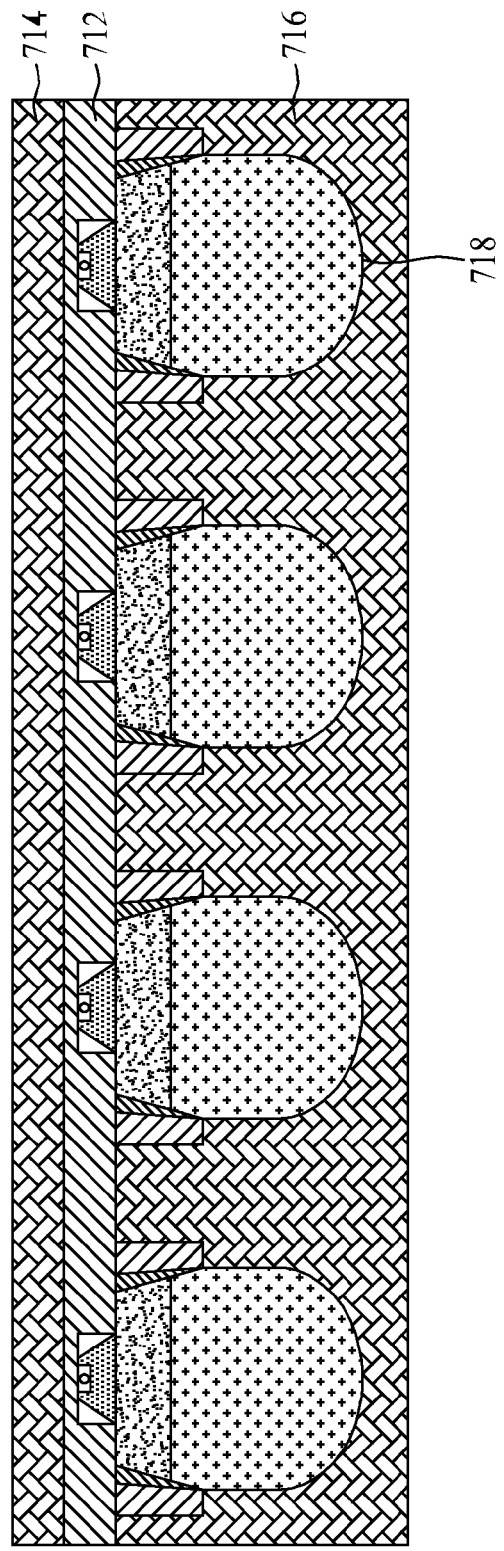
Figure 7C:
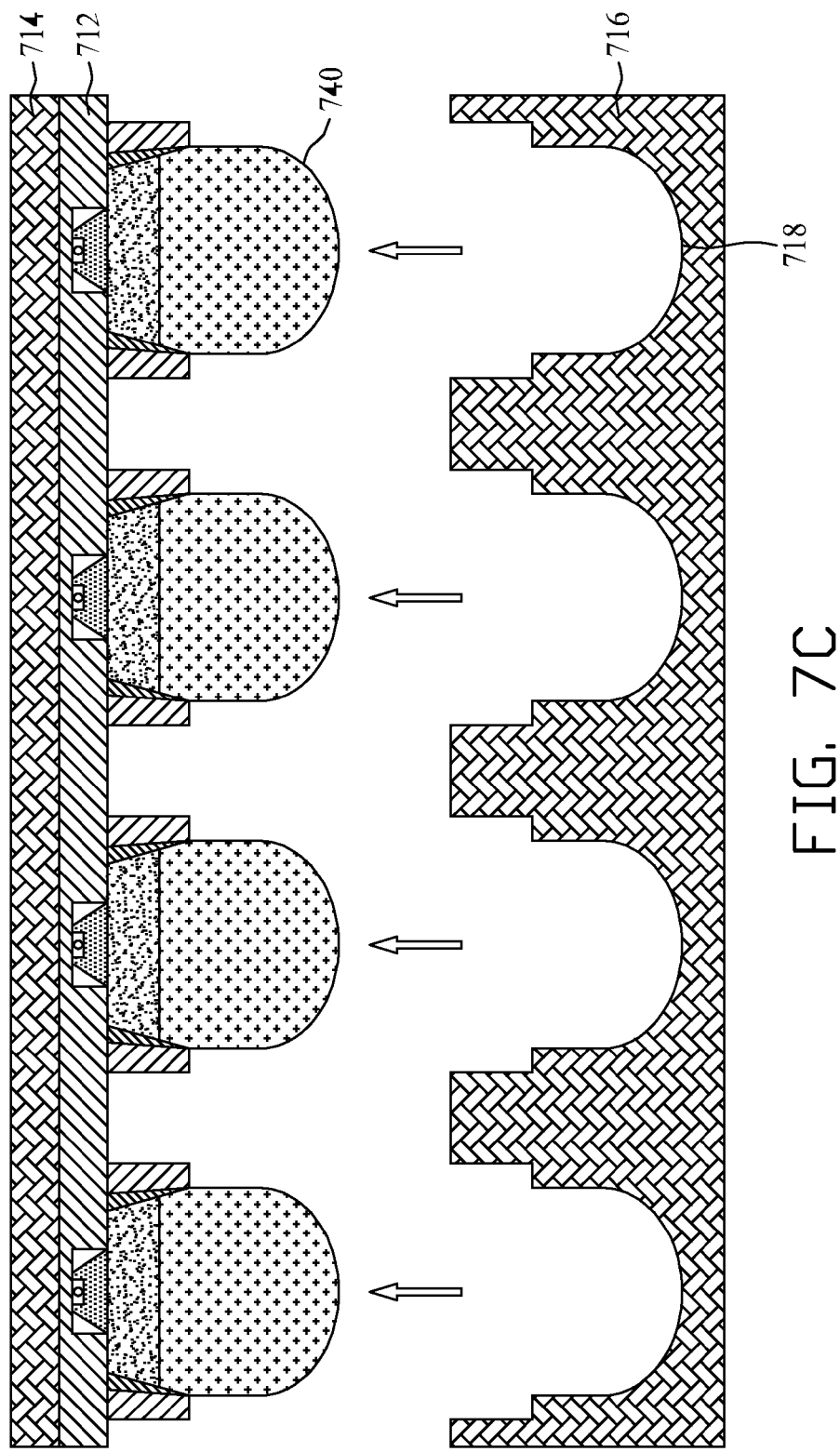

FIGS. 7A to 7C are cross-sectional views showing a method for fabricating the lens structure of a photoelectric device using a dipping and cooling process according to one embodiment of the present invention. In FIG. 7A, a plurality of reflective cups 722 and a packaging layer 726 are formed on the top surface of a ceramic substrate 712. In order to form a lens structure on the top surface of the ceramic substrate 712, the ceramic substrate 712 is loaded between the lower mold 714 and an upper mold 716. The upper mold 716 comprises a mold surface 718, which is configured to form lenses with desired shape and to hold liquid material 720.

Referring to FIG. 7B, after the lower mold 714 and the upper mold 716 are closed, the packaging layer 726 is dipped into the liquid material 720 held by the upper mold 716. After the liquid material 720 is cooled and solidified, the lower mold 714 is separated from the upper mold 716, which is removed thereafter, as shown in FIG. 7C. After detachment, photoelectric devices with lens structures are completed. Finally, cutting lines are formed on the ceramic substrate 712 using a laser or by a molding process, and a diamond knife, laser or water knife is used to cut the ceramic substrate 712 along the cutting lines to obtain separated photoelectric devices.

The above-described embodiments of the present invention are intended to be illustrative only. Numerous alternative embodiments may be devised by persons skilled in the art without departing from the scope of the following claims.

What is claimed is:
1. A photoelectric device, comprising:
   a ceramic substrate, a through hole defined in the ceramic substrate to define a second accommodation space therein;
   a thermal dissipation layer formed on a bottom surface of the ceramic substrate, with a part of the thermal dissipation layer filled in a bottom of the second accommodation space;
   at least two electrode layers formed on a top surface of the ceramic substrate, the at least two electrode layers spaced from the thermal dissipation layer and electrically insulated from the thermal dissipation layer;

a photoelectric die received in the second accommodation space and disposed on a top surface of the part of the thermal dissipation layer received in the second accommodation space, the photoelectric die electrically connected to the at least two electrode layers;

a reflective cup disposed on a top surface of the ceramic substrate so as to form a first accommodation space, wherein the reflective cup comprises a slantwise surface surrounding the first accommodating space;

a first packaging layer filled in a top end of the second accommodation space, directly contacting the photoelectric die, and enclosing the photoelectric die therein, the first packaging layer comprising phosphor powder;

a second packaging layer disposed within the first accommodation space on a top surface of the first packaging layer, a bottom surface of the second packaging layer mounted on a top surface of the first packaging layer; and a lens structure attached in the accommodation space and disposed on a top surface of the second packaging layer.

2. The photoelectric device of claim 1, wherein the second packaging layer comprises phosphor powder.

3. The photoelectric device of claim 1, wherein the first packaging layer is disposed within the second accommodation space.

4. The photoelectric device of claim 1, further comprising a reflective structure disposed on the top surface of the thermal dissipation layer and within the second accommodation space, wherein the photoelectric die is surrounded by the reflective structure.

5. A photoelectric device, comprising:

a ceramic substrate defining a cavity in a top thereof;

two electrode layers arranged on a top surface of the ceramic substrate and located beside the cavity;

a photoelectric die received in the cavity;

a first packing layer received in the cavity and encapsulating the photoelectric die, the photoelectric die being electrically connected with the electrode layers, the first packing layer directly contacting the photoelectric die, and the first packing layer comprising phosphor powder;

a reflective cup mounted on the ceramic substrate and defining a receiving space above the top of the ceramic substrate and the first packing layer; and a second packing layer received in the receiving space and covering the first packing layer.

6. The photoelectric device of claim 5, wherein the ceramic substrate further comprises a reflecting structure received in the cavity and surrounding the photoelectric die.

7. The photoelectric device of claim 6, further comprising a thermal dissipation layer formed on a bottom of the ceramic substrate and spaced from the electrode layers, wherein the thermal dissipation layer has a portion extending upwardly into the cavity, and the reflective structure, the photoelectric die and the first packing layer are on a top face of the thermal dissipation layer.

8. The photoelectric device of claim 7, further comprising a lens received in the receiving space and located on a top of the second packing layer.

9. The photoelectric device of claim 5, further comprising a lens received in the receiving space and located on a top of the second packing layer.

10. The photoelectric device of claim 5, wherein the reflective cup has an inclined inner face surrounding the receiving space.

11. The photoelectric device of claim 5, wherein the second packing layer comprises phosphor powder.

* * * * *